United States Patent
Akiona et al.

(10) Patent No.: US 10,838,850 B2
(45) Date of Patent: Nov. 17, 2020

(54) ROBOTIC REGRESSION TESTING FOR SMART DEVICES

(71) Applicant: Accenture Global Solutions Limited, Dublin (IE)

(72) Inventors: Nicholas Akiona, San Jose, CA (US); Teresa Sheausan Tung, San Jose, CA (US); Carl Matthew Dukatz, San Jose, CA (US)

(73) Assignee: Accenture Global Solutions Limited, Dublin (IE)

(*) Notice: Subject to any disclaimer, the term of this patent is extended or adjusted under 35 U.S.C. 154(b) by 0 days.

(21) Appl. No.: 16/199,983

(22) Filed: Nov. 26, 2018

(65) Prior Publication Data

US 2019/0163618 A1 May 30, 2019

Related U.S. Application Data

(60) Provisional application No. 62/591,031, filed on Nov. 27, 2017.

(51) Int. Cl.
  *G06F 9/44* (2018.01)
  *G06F 11/36* (2006.01)
  (Continued)

(52) U.S. Cl.
  CPC ...... *G06F 11/3688* (2013.01); *G05B 23/0281* (2013.01); *G06F 11/3684* (2013.01);
  (Continued)

(58) Field of Classification Search
  CPC .................................................. G06F 11/3688
  (Continued)

(56) References Cited

U.S. PATENT DOCUMENTS

| 8,826,084 B1 | 9/2014 | Gauf et al. |
| 8,996,166 B2 * | 3/2015 | Jenkinson ............ G06F 3/0418 345/174 |

(Continued)

FOREIGN PATENT DOCUMENTS

| CA | 2775165 | 10/2012 |
| CN | 105512036 | 4/2016 |

OTHER PUBLICATIONS

Mao et al, "Robotic testing of mobile apps for truly black-box automation" IEEE Software. Mar. 28, 2017;34(2): 11-6.

(Continued)

*Primary Examiner* — Wei Y Zhen
*Assistant Examiner* — Lanny N Ung
(74) *Attorney, Agent, or Firm* — Fish & Richardson P.C.

(57) ABSTRACT

Methods, systems, and apparatus, including computer programs encoded on a computer storage medium, for generating multiple distinct test plans using a computing system. The system merges the each of the test plans to produce a first test plan and obtains performance data about automated execution of the first test plan by a robotics system. The system generates learned inferences for determining predictions about execution of the first test plan based on analysis of the performance data and adjusts the first test plan based on the learned inferences. The system generates a second test plan for execution by the computing system based on adjustments to the first test plan and performs the second test plan to test multiple devices using the robotics system.

19 Claims, 8 Drawing Sheets

(51) Int. Cl.
 *G05B 23/02* (2006.01)
 *G06N 5/04* (2006.01)
 *G06N 20/00* (2019.01)
 *G06Q 10/06* (2012.01)
 *G06F 30/20* (2020.01)

(52) U.S. Cl.
 CPC .............. *G06F 30/20* (2020.01); *G06N 5/04* (2013.01); *G06N 20/00* (2019.01); *G06Q 10/06* (2013.01)

(58) Field of Classification Search
 USPC ........................................................ 717/124
 See application file for complete search history.

(56) References Cited

U.S. PATENT DOCUMENTS

| | | | | |
|---|---|---|---|---|
| 9,283,672 | B1* | 3/2016 | Matthews | G01M 99/008 |
| 10,296,444 | B1* | 5/2019 | Choudhary | G06F 11/3692 |
| 2013/0191814 | A1 | 7/2013 | Fujii et al. | |
| 2014/0111484 | A1 | 4/2014 | Welch et al. | |
| 2014/0115565 | A1* | 4/2014 | Abraham | G06F 8/30 717/128 |
| 2015/0169432 | A1* | 6/2015 | Sinyagin | G06F 11/3684 717/124 |
| 2017/0286880 | A1 | 10/2017 | Wigg et al. | |

OTHER PUBLICATIONS

AU Office Action in Australian Appln. No. 2018271267, dated Aug. 22, 2019, 4 pages.
AU Examination Report in Australian Appln. No. 2018271267, dated May 22, 2019, 6 pages.
AU Office Action in Australian Application No. 2018271267, dated Jan. 8, 2020, 6 pages.
Limaiem et al., "CATIP: a computer-aided tactile inspection planning system", International Journal of Production Research, Feb. 1999, 37(2):447-465.
Salmeron et al., "Adding Correctness Checking to Test Automation Platform", 2017 IEEE International Symposium on Software Reliability Engineering Workshops (ISSREW), Oct. 2017, pp. 132-138.
Tone, "Flexible Product Testing Using an Articulated Robot System Equipped with a Real-Time Force and Torque Sensor", Faculty of Engineering, Lund University, May 2015, 66 pages.

* cited by examiner

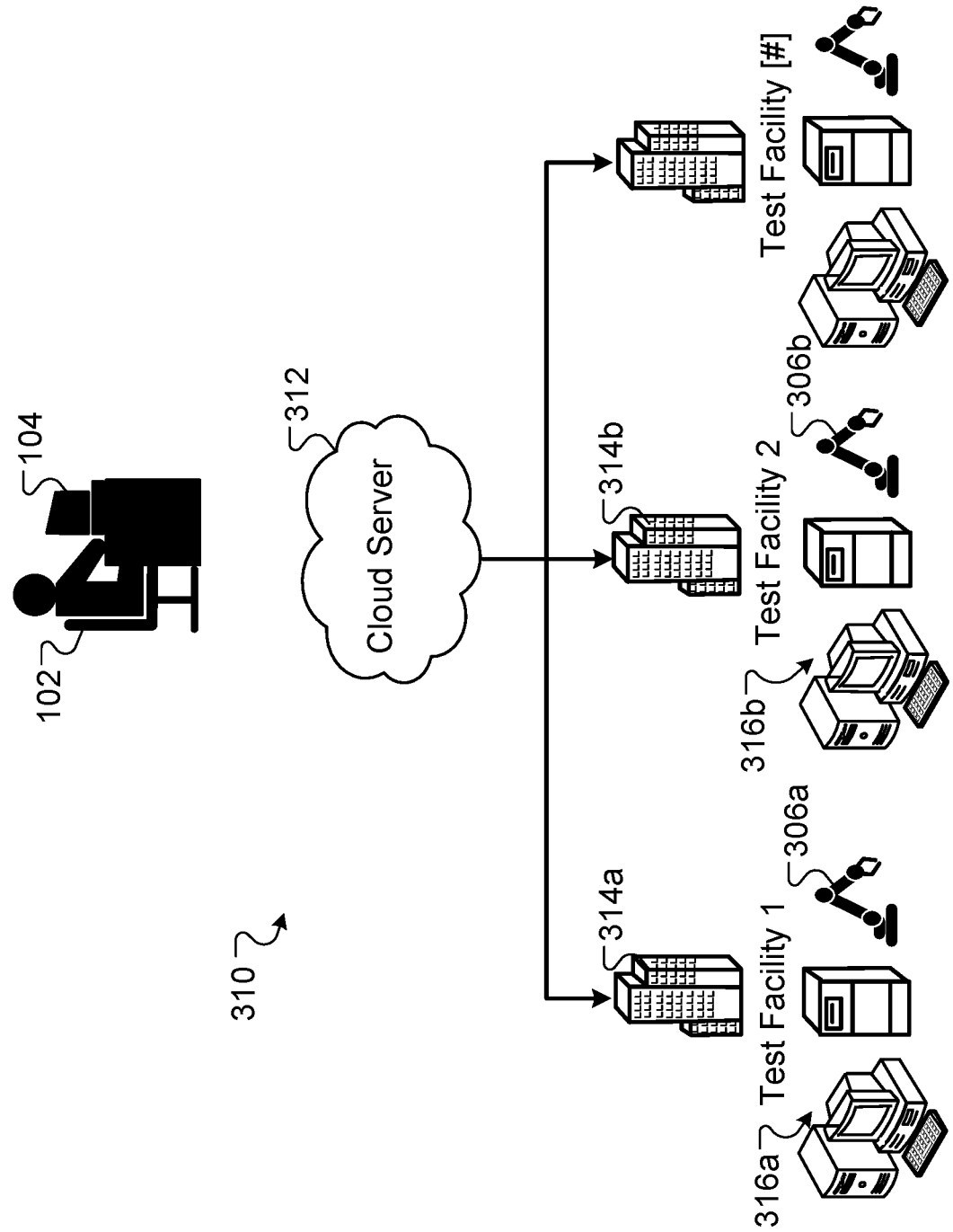

ROBOTIC REGRESSION TESTING FOR SMART DEVICES

CROSS-REFERENCE TO RELATED APPLICATION

This application claims the benefit of U.S. Provisional Application No. 62/591,031, filed Nov. 27, 2017, the contents of which are incorporated by reference herein.

FIELD

This specification relates to process automation.

BACKGROUND

Automation technology is becoming increasingly accessible and applicable to a vast number of industries and enterprise applications. Many companies have substantial unrealized opportunities for improving business processes with automation processes. For example, some energy companies accomplish device testing by relying on workers to manually push buttons on hundreds of devices in order to test performance of firmware installed on each device. With thousands or even millions of tests to run and limited testing windows and multiple firmware versions, some companies may be forced to sample test firmware functions of the devices.

Companies are often unable to perform all possible tests on each firmware version. In some cases, there can be millions of tests to perform due to a large number of regression tests that may be required to check firmware compatibility between different devices. Companies can accumulate substantial risk when sample testing is used in lieu of performing a more comprehensive assessment of their devices. Hence, business processes that include device analysis and testing can be improved by leveraging technology to automate manual tasks.

SUMMARY

This specification describes computing solutions for implementing robotics technology for automating end-to-end testing of smart devices. Mechanical systems and computing processes are described for using robots to make end-to-end device testing automated and traceable at scale. The smart devices can be metering devices, such as electric meters and gas meters, used by utility companies that provide energy services to commercial and residential customers.

Mechanical aspects of the solution utilize a wall-mounted gantry robot to push buttons and scan display screens of various metering devices to read and interpret data presented for display at the device. The robots are configured to perform push button functions that also introduce physical perturbations into the device testing scheme. The physical perturbations can encompass human inconsistencies that are similar to, or substantially similar to, inconsistencies that can occur when human testers manual perform push buttons during a test. The perturbations can include pressing a button more than an amount needed to complete a particular test or having to backtrack to press a button during a test. Other perturbations can include causing button press locations to be imprecise as well as varying button presses in terms of force, location, and path of a button press.

Computational processes include testing or evaluating task scheduling and task synchronization across multiple smart devices and robot(s). For example, a computing system is configured to perform parallelization and optimization of device testing tasks across multiple robots through action and verification task schemas. The system continuously improves scheduling of testing tasks based on performance learning from analysis of previous task schedules and data generated from other device tests. The system is also configured to determine new testing schemas for generalizable task automation.

The system can interface with infrastructure systems for different public or private entities that provision utility services. For example, the system uses software development kits to develop software tools for accessing information on a device under test that controls monitors energy services to different consumers. The system can use the software tools to access information through a software interface of a metering device that is being tested. The system can also communicate with infrastructure systems to facilitate changes to energy services (e.g., an electric load) during testing of the device.

One aspect of the subject matter described in this specification can be embodied in a computer-implemented method. The method includes generating, by a task module of a computing system, multiple distinct test plans; merging, by the task module, each of the multiple distinct test plans to produce a first test plan for execution by the computing system; and obtaining, by the computing system, performance data about automated execution of the first test plan by a robotics system controlled by the computing system. The method also includes, generating, by a learning module of the computing system and based on analysis of the performance data, a set of learned inferences for determining predictions about execution of the first test plan; adjusting, by the task module, the first test plan based on the set of learned inferences and determined predictions about execution of the first test plan; generating, by the task module and based on adjustments to the first test plan, a second test plan for execution by the computing system; and performing, by the computing system, the second test plan to test multiple devices using the robotics system controlled by the computing system.

These and other implementations can each optionally include one or more of the following features. For example, in some implementations, merging each of the multiple distinct test plans includes: identifying overlapping test portions of at least two test plans by matching one or more strings that describe respective actions in each of the two test plans; and merging that at least two test plans based at least on the identified overlapping portions.

In some implementations, merging each of the multiple distinct test plans includes: identifying one or more transitions across the two test plans, wherein a transition represents changing from a first testing action to a second testing action; and merging the at least two test plans based on the identified overlapping portions and the identified one or more transitions.

In some implementations, merging each of the multiple distinct test plans includes: weighting the merging towards one or more initial test steps of the at least two test plans, where a step that follows an initial test step is non-time dependent; and merging text strings that describe testing actions associated with an initial test steps for testing multiple devices of the same device type.

In some implementations, adjusting the first test plan includes: optimizing the first test plan to generate the second test plan, wherein the first test plan is optimized using inferred learnings from executing the first test plan.

In some implementations, generating the set of learned inferences includes: using a neural network to perform inference computations as part of the analysis of the performance data about automated execution of the first test plan; and generating the learned inferences based on the inference computations.

In some implementations, performing the second test plan includes: causing, by the robotic system, one or more physical perturbations at a device that is under test, wherein the one or more physical perturbations are caused around a desired location of the device based on a characteristic of an input feature of the device.

In some implementations, the method further includes randomly simulating human error by overshooting or undershooting device processing goals of the device that is under test, based on a particular device processing ontology that is associated with software functions of the device.

Other implementations of this and other aspects include corresponding systems, apparatus, and computer programs, configured to perform the actions of the methods, encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The subject matter described in this specification can be implemented in particular implementations and can result in one or more of the following advantages. The described subject matter can be implemented to perform testing task synchronization across robots that automate testing multiple smart devices operating in parallel. A computing system is configured to provide highly dynamic and variable task scheduling for test plans. The system includes a robotic system with mechanical features that enable improved task scheduling flexibility over other systems.

The computing system executes continuously changing test sets with similar underlying functionality requirements. The described system efficiently executes coded processes to provide flexible abstractions for testing actions and verifications. The system enables test script transfers between multiple devices produced by different manufacturers and that execute different firmware versions. Integrated tests and robotic systems are described for accomplishing physical interaction with multiple devices from different manufacturers.

The described computing system enables efficiencies, such as increased system throughput and reduced processor utilization. Efficiencies can be realized by merging test plans to reduce the overall quantity of test plans to be execute and using learned inferences to revise existing test plans. Revised test plans enable some tasks to be performed in parallel, thereby reducing overall system execution time for completing certain test plans.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

FIG. 3C shows an example computing environment for executing teleoperations to perform automated robotic testing of a device.

Like reference numbers and designations in the various drawings indicate like elements.

DETAILED DESCRIPTION

Figure 1:
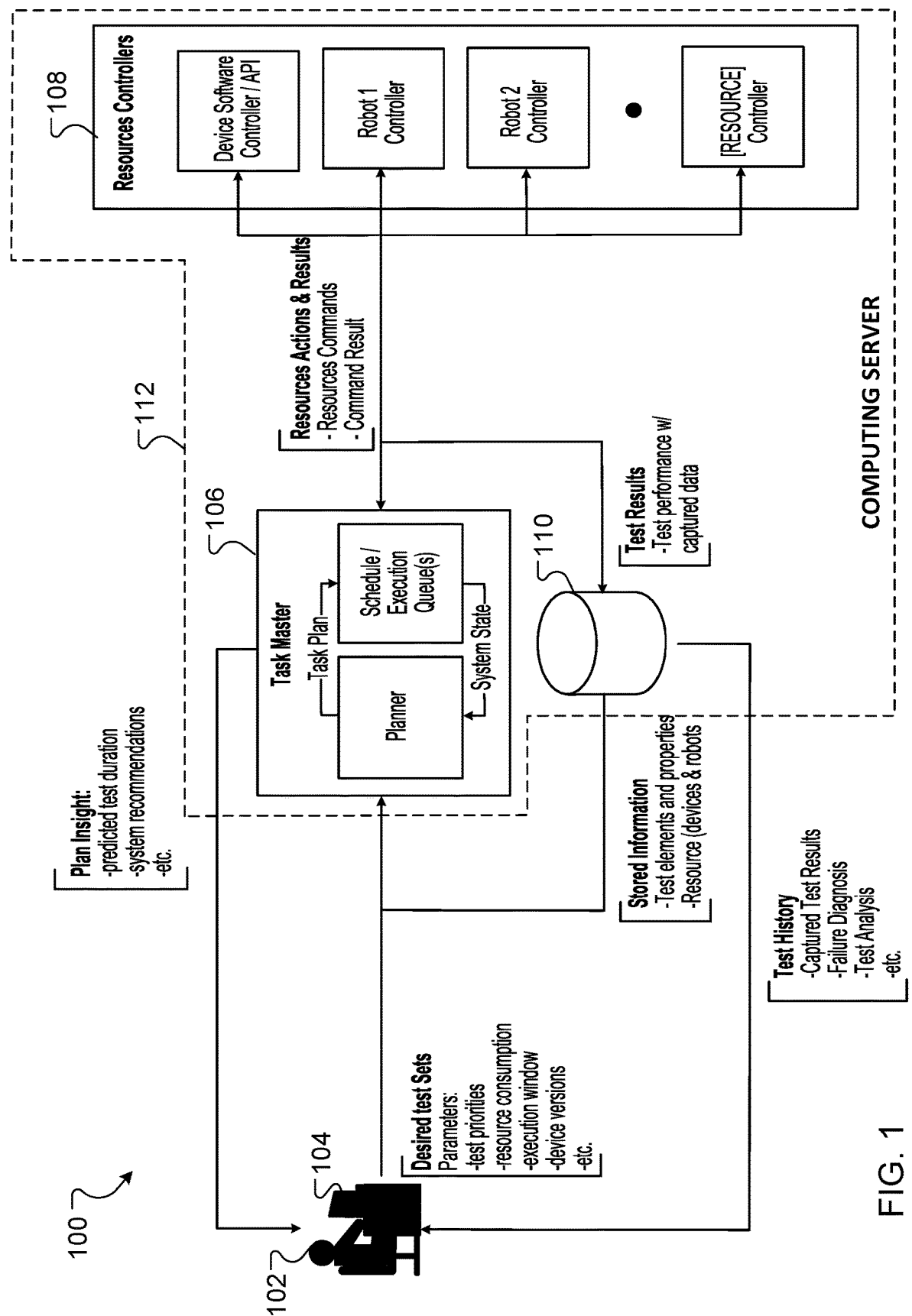
FIG. 1 is a block diagram of a computing system for performing automated robotic testing of a device.

FIG. 1 shows a block diagram of a computing system 100 for performing automated robotic testing of a device. System 100 includes client device 104, task master system 106, resource controllers 108, and data repository 110. In some implementations, system 100 includes an example computing server 112 that hosts computing modules for implementing functions of task master system 106, resource controllers 108, and data repository 110. Although depicted in FIG. 1 as a desktop computer console, client device 104 can be any known computer system, such as a desktop computer, a laptop computer, a tablet device, a mobile device, a smartphone, or any other related computing device that receives user input and that can transmit, transfer, or otherwise provide data and input commands to server 112.

Task master 106 provides computing logic for generating one or more test plans of system 100. The test plans can be used to test functionality of one or more hardware metering devices. In some implementations, a group of test plans represent an example task plan that can be scheduled and executed by system 100. For example, respective test plans that form a task plan are configured for sequential or parallel execution. The task master 106 can maintain an execution queue that tracks individual execution of each scheduled test plan of a task plan. In some implementations, the task master 106 monitors a system state of the respective hardware devices being tested based on information received from resource controllers 108.

Resource controller 108 includes computing logic for providing commands to different resources and for monitoring command results, e.g., the result of a resource executing the provided command. For example, resource controller 108 can provide a command or instruction to an example robotic resource used to test a hardware metering device. Performance of the commands by the robotic resource causes the robotic resource to interact with the hardware device to accomplish testing physical and software related features of the device. For example, the commands provided by resource controller 108 are received and processed by a respective controller of robot 1 and robot 2. The commands used to control robot 1 and robot 2 to cause the robots to execute tests of a task plan to test a gas meter or electric meter. In some implementations, resource controller 108 includes an application programming interface (API) for interfacing with a software controller or application program of a device under test. For example, the resource controller can interface with the device in response to establishing a wireless connection with a metering device.

Data repository 110 stores data describing various elements (e.g., test elements) that can be used to create a test plan as well as properties of a test plan. For example, a test plan can be formed from multiple discrete test scripts that each correspond to a respective test element of the test plan. An example first test script of a test plan may be configured to cause robot 1 to interact with a metering device under test to push a particular set of physical buttons on the device. Similarly, an example second test script of the test plan may be configured to cause robot 1 to interact with the metering device under test to a particular software function of the device. Data repository 110 is also configured to store data about each of the resources and robot devices that are associated with a particular task plan. Results of an executed task plan that includes performance test data can be also stored at data repository 110.

The computing server 112 is configured to implement or access each of task manager 106, resource controller 108, and data repository 110. For example, task manager 106, resource controller 108, and data repository 110 can be included within server 112 as a sub-system of hardware circuits. In general, server 112 can include one or more processors, memory, and data storage devices that collectively form one or more computing systems of server 112. Processors of the computing systems process instructions for execution by server 112, including instructions stored in the memory or on the storage device to display graphical information for a graphical user interface (GUI) on a display of client device 104.

Execution of the stored instructions can cause one or more of the actions described herein to be performed by server 112 or by the respective computing resources accessible by server 112. In other implementations, multiple processors may be used, as appropriate, along with multiple memories and types of memory. For example, server 112 may be connected with multiple other computing devices, with each device (e.g., a server bank, groups of servers, modules, or a multi-processor system) performing portions of the actions or operations for processes or logical flows described in this specification.

As used in this specification, the term "module" is intended to include, but is not limited to, one or more computers configured to execute one or more software programs that include program code that causes a processing unit(s)/device(s) of the computer to execute one or more functions. The term "computer" is intended to include any data processing or computing devices/systems, such as a desktop computer, a laptop computer, a mainframe computer, a personal digital assistant, a server, a handheld device, a smartphone, a tablet computer, an electronic reader, or any other electronic device able to process data.

Figure 2A:
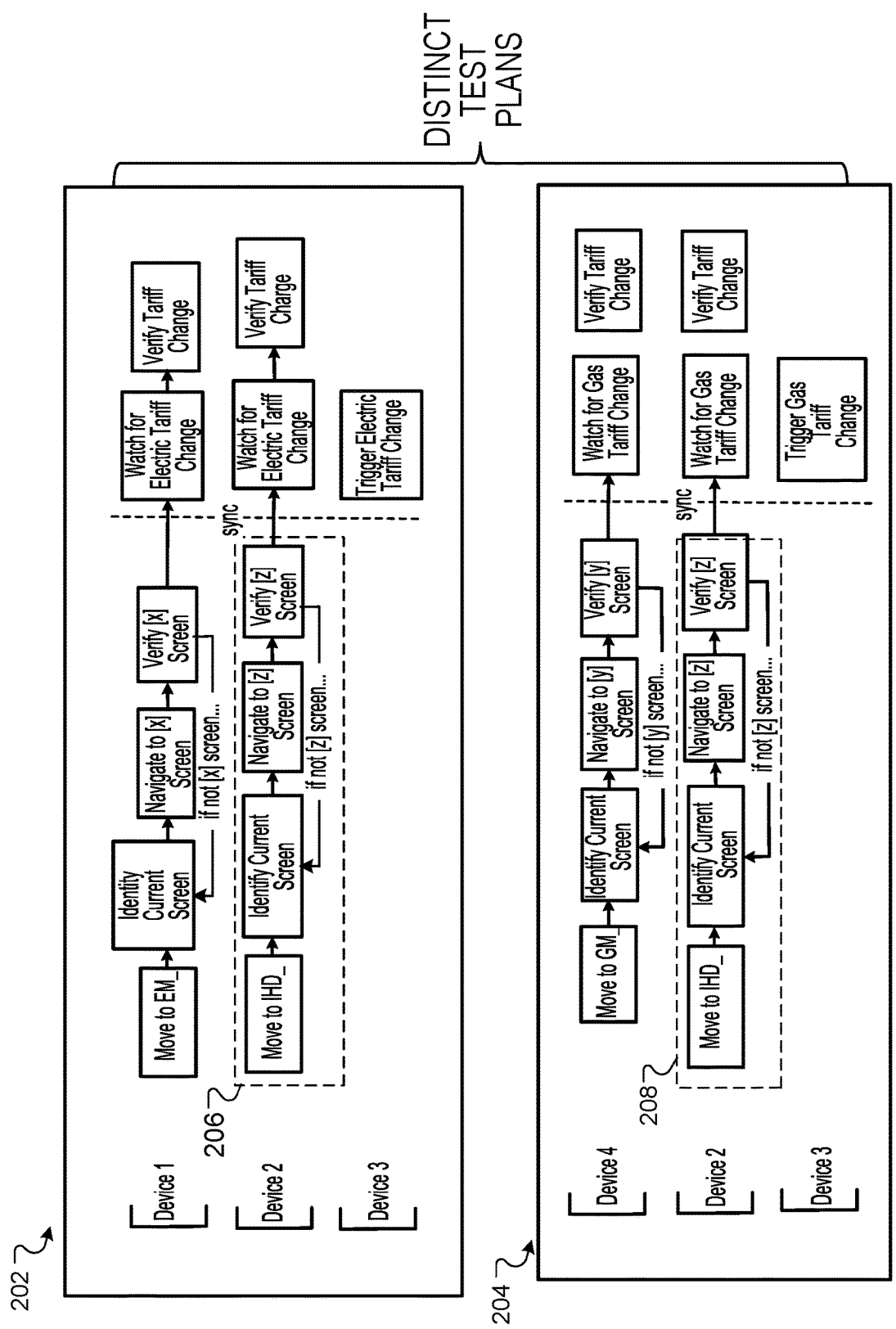
FIG. 2A shows distinct test plans for performing automated robotic testing of a device.

FIG. 2A shows distinct test plans 202, 204 for performing automated robotic testing of a device. In some implementations, test plans specify resource types for a testing process. The resource types can represent the different types of smart devices that will be tested. For example, the smart device represented by a resource type can be an electric meter (EM), a gas meter (GM), or an in-home display of a gas meter. System 100 can form test plans by combining or merging multiple action and verification blocks 206, 208 into one or more test plans. In some instances, different test conditionals can be included when system 100 strings together (e.g., combines or merges) the action and verification blocks 206, 208.

An example test plan can include software scripts or scripted commands for executing one or more robot actions to test a device. For example, the scripted commands of a test plan can cause robot actions such as moving the robot a particular device under test, e.g., an electric or gas meter. Other robot actions include identifying a current display screen of the device, navigating to a particular software screen of the device, verify that a desired screen is being displayed at the device. Identifying and verifying a current screen of the device can include using a camera of the robot to view real-time video or image data that shows the current display or software screen of the device. A test plan can also include at least one sync line that is used to indicate points in a test plan where coordination is required between multiple devices that are being tested. For example, a sync line can be used to synchronize identifying or watching for an indication of an electric tariff change at multiple devices under test. As described in more detail below, system 100 is configured to merge multiple distinct test plans to generate at least one combined or merged test plan.

Figure 2B:
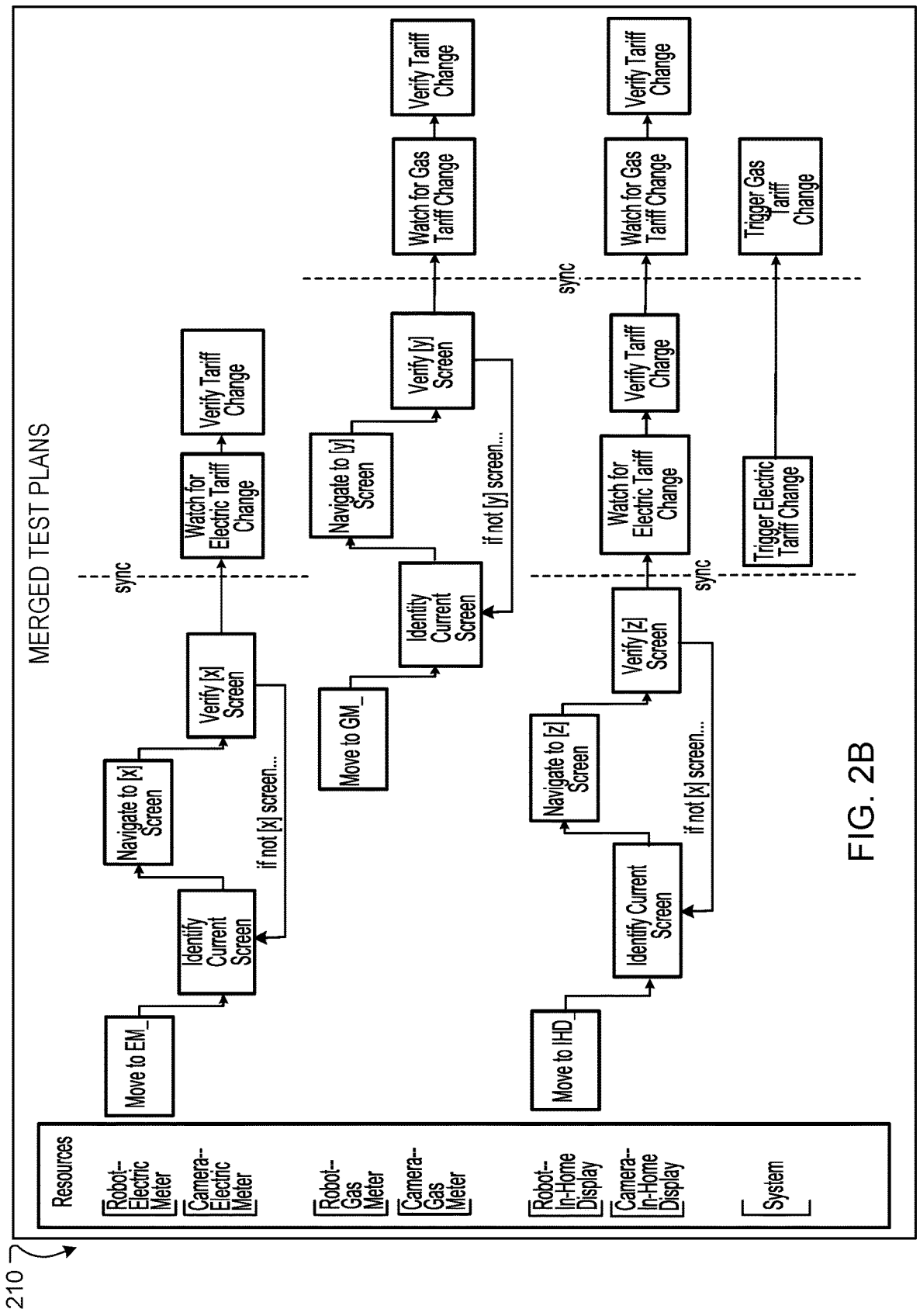
FIG. 2B shows merged test plans for performing automated robotic testing of a device.

FIG. 2B shows merged test plans 210 for performing automated robotic testing of a device. System 100 generates test plans 210 by identifying overlapping test portions of at least two separate test plans that can be combined. The tests can be submitted to the task planner of task master 106. For example, identifying overlapping portions of tests can include determining identical terms or strings describing actions, verifications, and transitions across sets of test plans. Based on this determination, computing modules of task master 106 can identify multiple strings, e.g., text strings, that can be generally merged to produce a merged test plan 210. In some implementations, merging non-identified strings is dependent on each string having the same starting state. The modules can be configured to weight merging towards initial test steps (e.g., setup), where the resultant state must be non-time dependent. In some instances, merged strings are used for tests that are planned for the same device type.

In some implementations, system 100 uses merged test metadata of a test plan 210 to determine resource/device configurations and locations for performing a test process. For example, system 100 determines these configurations and locations based on estimated firmware test duration percentages obtained from the identified overlapping test portions and from data indicating the physical device locations. System 100 determines one or more device configuration groupings from the configurations and locations.

System 100 is also configured to generate multiple synchronized test plans. In some implementations, system 100 can use task master 106 to schedule and/or distribute multiple test plans that require synchronization across distinct physical resources. Task master 106 causes synchronized tests factors in device groupings to be scheduled to balance resource execution time. In some implementations, system 100 merges multiple tests while factoring in resource constraints, device locations, user constraints, and step execution time. System 100 can also use task master 106 to distribute plans of a test pool across the resources as well as order performance of different tests, distribute test plans, and arrange tasks that are required to execute or perform the different tests using the test plans.

Figure 3A:
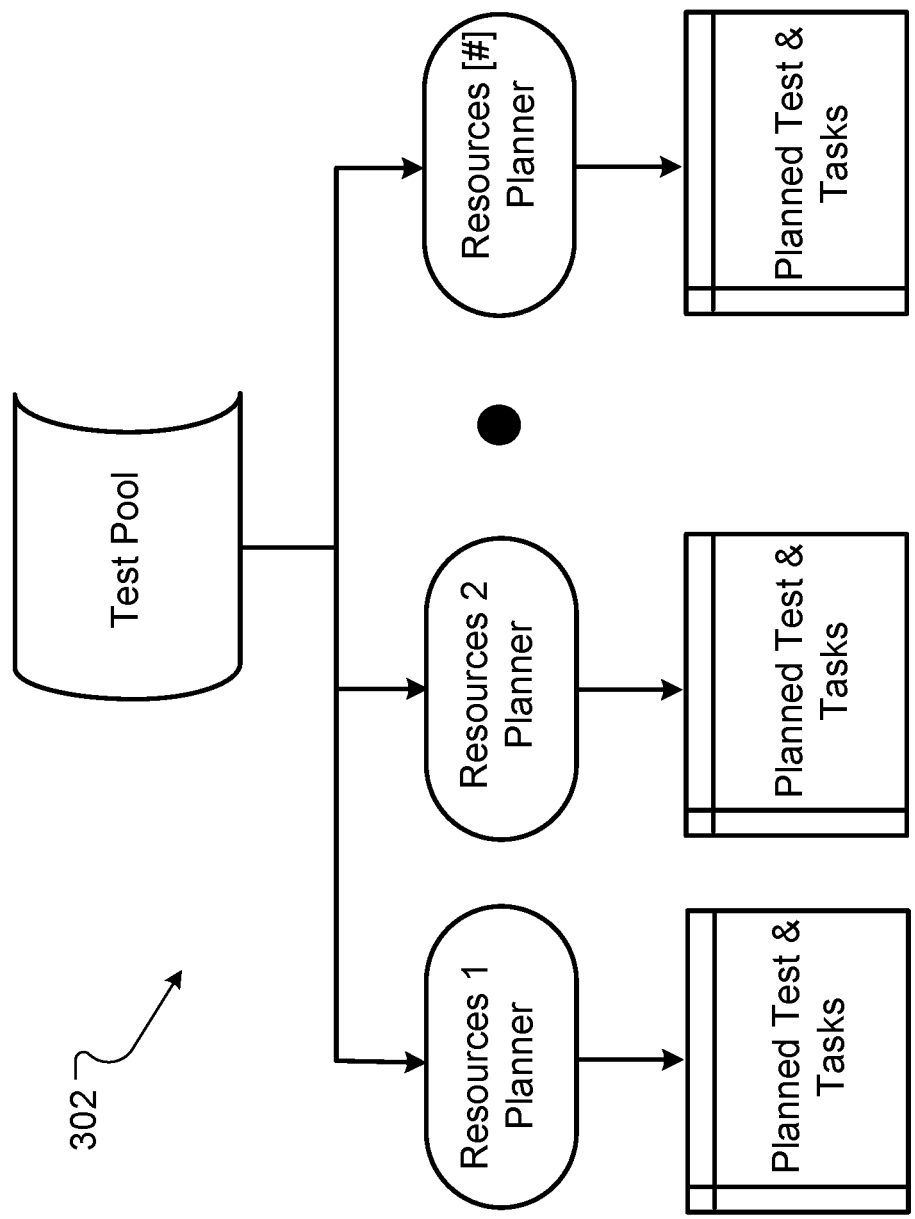
FIG. 3A shows a flow diagram associated with test plan distribution.

FIG. 3A shows a flow diagram 302 associated with test plan distribution. System 100 can use resource controller 108 to assign tests that are associated with at least one merged test plan 210. For example, resource controller 108 can cause each resource to be assigned tests from an overall test pool of distinct or merged test plans. In some implementations, tests are assigned in groups that proportionately match smart devices which are operable by a particular robot resource. System 100 can perform continuous load balancing during test plan distribution. For example, task master 106 can be used to determine or compute respective time estimates for different tasks of the respective test plans. Based on the computed time estimates, system 100 can manage overall time estimates of each resource planner to provide even and balanced test distribution.

In some implementations, user 102 can specify certain non-time sensitive tests that generally include shorter tasks. Non-time sensitive test may not require coordination with other resources and can be distributed between longer tasks in strings of a test plan. Distribution of non-time sensitive tasks can include analyzing information such as resource types, time constraints, periodic tasks, and other parameters related to executing a particular test plan. In general, test plan distribution includes assigning tests/tasks to individual devices and system 100 can be configured to limit maximum individual task strings to reduce overall test complexity. System 100 also factors available resources into test plan distribution, executes test merging for devices from multiple firmware versions, and uses computing loop execution for test plan distribution, where the loop executes until no tests remain in the test pool.

Figure 3B:
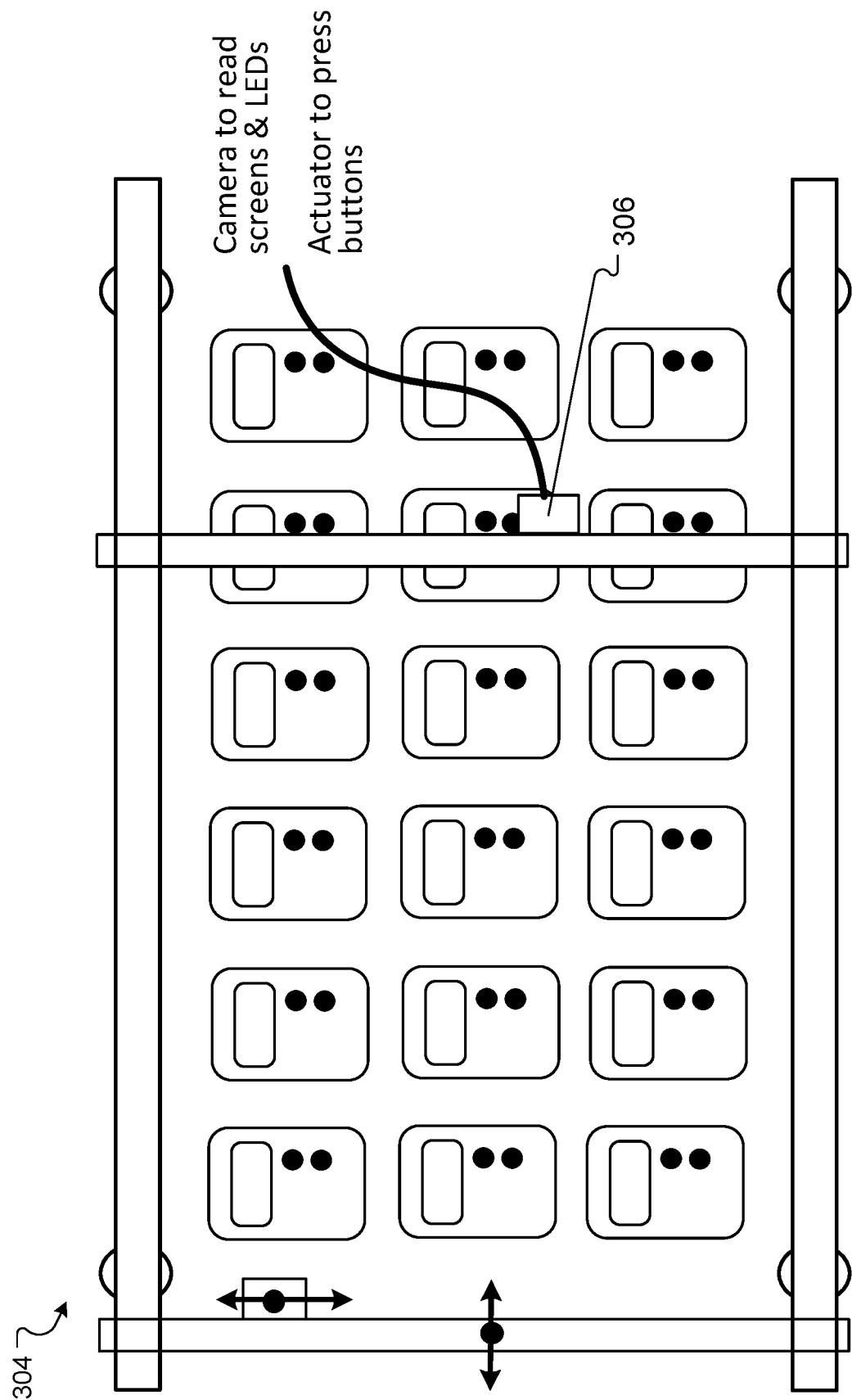
FIG. 3B shows an example robotic system for executing test plans distributed by the computing system of FIG. 1.

FIG. 3B shows an example robotic system 304 for executing test plans distributed by the computing system of FIG. 1. Robotic system 304 includes one or more cameras for reading and receiving LED notifications and data displayed by each smart device being tested. System 100 can be configured to generate test plans including tasks for causing physical perturbations at the devices being tested. For example, the test plans can be executed to systematically vary a position of a robot, with regard to actuation, in order to mimic human performance during manual tests. When performing test plans, system 100 can provide control signals for varying a timing of the robots to verify robustness of a device interface to human performance. In some implementations, system 100 causes the physical perturbations by using a Gaussian distribution around a desired location based on resource/device characteristics. Example characteristics can include robot repeatability and accuracy, receiving device wear, wear due to strain and stress properties, as well as other characteristics relating to physical attributes of the robot and/or device being tested.

System 100 can be also configured to generate test plans that include tasks for causing process perturbations at the devices being tested. For example, the test plans can be executed to randomly simulate human error by overshooting or undershooting device processing goals, e.g., scrolling too far through a menu and having to return to a previous menu. Process perturbations can build off of ontologies and schemas associated with particular device functions. In some implementations, for actions such as scrolling and repeated pressing, system 100 can use a weighted random number generator to determine overshooting or undershooting parameters. The parameters can be determined by factoring in elements such as number of presses to reach the desired position and actuation frequency.

To setup new smart devices for testing, system 100 can be configured such that example users, e.g., user 102, can tele-operate each robot 306 of robotics system 304 and manually control robot resources, such as cameras and software triggers. For example, user 102 can tele-operate robot 306 to move a robot end effector over a device button, test the actuation of the button using robot 306, and then save position and steps required to physically interact with the device, e.g., an electric or gas meter. A similar process can be used to setup visual interpretation of device display screens, device features/functions, and device positions. In some implementations, system 100 can store one or more calibration routines that can be accessed and executed or run to verify accuracy of a test setup.

Described smart devices of this document can be reclosers or related smart grid devices that are positioned on power lines. The smart grid devices can be large scale switches that are configured to protect the power characteristics of a power grid. For example, faults can create current surges and reclosers may operate as a fuse in this instance. When the fuse is closed, power can flow, and when open, an open circuit condition is present to preclude current flow. In some implementations, a recloser can attempt to open for a few seconds to check if the fault was temporary or continuous and make, for example, three attempts before remaining open. In some instances, performance of reclosers can be verified using high-speed computer vision and robotic schemes can be used for triggering faults.

In some implementations, meters and related smart devices do not have buttons and displays of the devices will rotate through display values. Device testing in some geographic areas may include only vision, device display viewing, and manual teleoperation using robotic devices and systems described in this document. Further, for certain some geographic areas, system 100 can use robotic testing to control knobs and dials on an example test board and button pressing can be used for testing IHDs or thermostats in these areas. Some tests executed using system 100 are configured to occur at specific times, e.g., schedule an action for 7 pm. Thus, system 100 can be configured to include a scheduling component for scheduling tests at specific times and for verifying meter rates during on-peak versus off-peak times.

Robotic system 304 can represent a Robotic Test Automation (RTA) system that user 102 uses to manually execute device testing either by hand or by commanding individual resource actions through software commands triggered through teleoperation. In some implementations, resource controller 108 may determine that a teleoperation process is consuming individual resources. Resource controller 108 can provide data signals to task master 106 that cause the task planner to consider the consumed individual resources as being unavailable. System 100 stores test history data and test logs in data repository 110, where the data and logs can relate to executed, or executing, test plans. User 102 can access data repository 110 to view test history information as well as stored test logs that includes performance information about an executed test. For example, the performance information includes images and test data describing perturbations that were induced at, or applied to, a device under test. User 102 can also view which tests are being currently performed by robotics system 304 as well as the expected completion times for each test and any tasks included in each test.

FIG. 3C shows an example computing environment 310 for executing teleoperations to perform automated robotic testing of a device. Environment 310 can be used by user 102 to remotely setup, execute, and evaluate tests including test plans and tasks across multiple locations. The multiple locations can correspond to test facility 314a and test facility 314b. As shown at FIG. 3C, test facility 314a can include at least one test robot 306a while test facility 314b can include at least one test robot 306b. Hence, a distinct benefit of the automation process described in this document is that user inspection and system operation can be performed remotely using computing devices of environment 310. For example, client device 104 can access cloud server 312 to control robots 306a and 306b based on software instructions and data signals transmitted remotely to each test facility.

In some implementations, cloud server 312 enables client device 104 to transmit instructions and control signals to computing resources 316a and 316b at respective test facilities 314a and 314b. Environment 310 can allow trained experts, based remotely or in a central hub, to perform and analyze tests across geographically distributed test facilities. In some implementations, environment 310 provides increased utilization of skilled labor and improved employee retention as users 102 (e.g., workers) can live in preferable areas while test facilities can be in less expensive, undesirable locations.

System 100 is configured to interface with various utility services and infrastructure systems for different entities that provision utility services. In some implementations, system 100 can use an example software development kit (SDK) to obtain or develop different software tools for accessing information on a device under test. For example, system 100 can use the developed tools to access the information through a software interface of the device. In other implementations, during device testing, system 100 can communicate with one or more infrastructure systems to facilitate changes to an electric load on an electric metering device or a gas load on a gas metering device, to evaluate various metering functions of the respective devices. For example, based on a data connection to the infrastructure systems, the system 100 can cause changes to an electrical load monitored by an electric metering device to evaluate or test one or more software or hardware functions of the electric metering device. The system evaluates or tests software and hardware functions of a device under test in response to causing the change to the electrical load monitored by the device under test.

Figure 4:
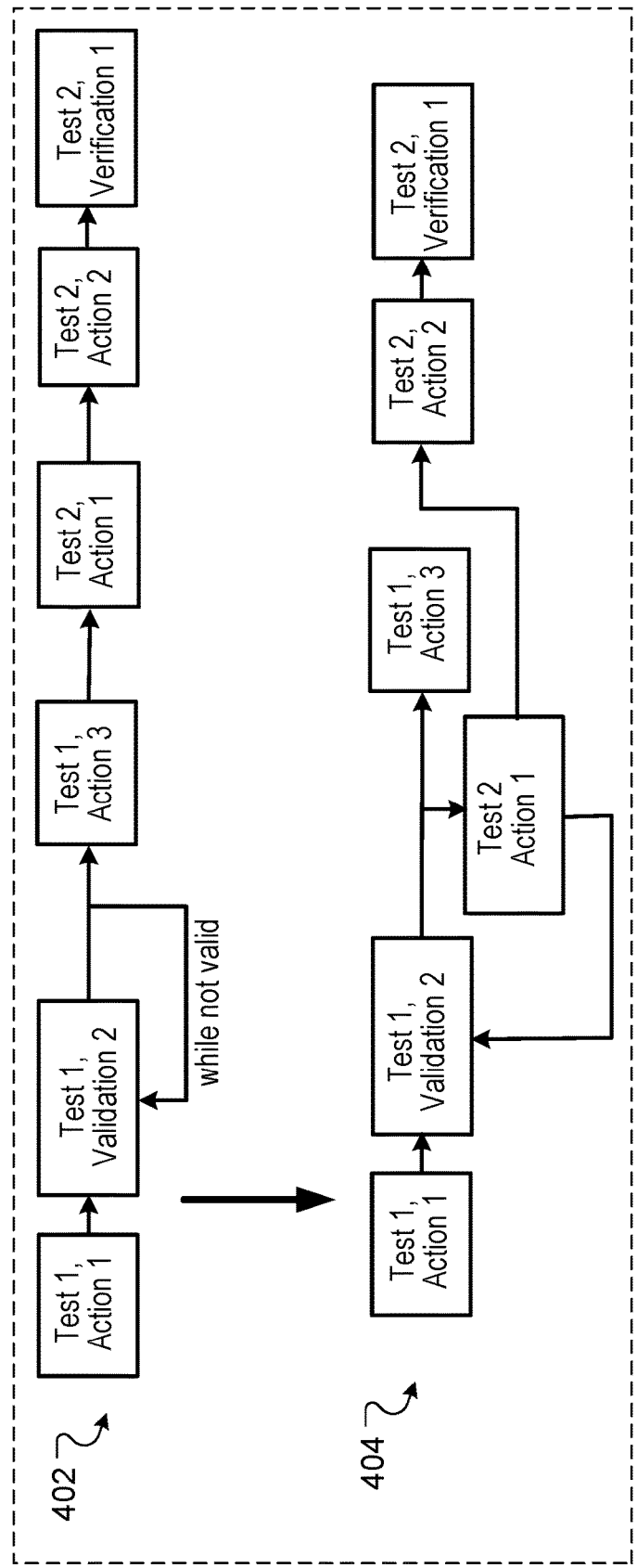
FIG. 4 shows test plans and graphical data used to produce revised test plans.
Figure 4:
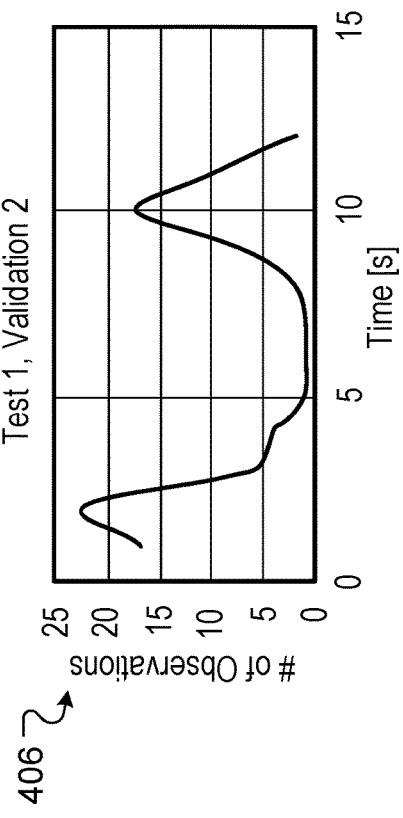

FIG. 4 shows test plan 402 and graphical data 406 that can be used to produce revised test plan 404 based on learned inferences. As the system 100 operates, the system collects and stores performance metrics for durations and success rates of various actions and verifications associated with a test plan being executed. System 100 can be configured to analyze the performance metrics using weighted statistical regression, neural networks, data clustering methods, and related machine learning techniques. System 100 can use an example neural network to perform inference computations as part of the analysis of the performance metrics. System 100 can generate learned inferences in response to the inference computations and analysis of the data describing the test results. System 100 uses the inferred learnings to modify or optimize existing test plans. For example, system 100 can use learned inferences to refine task duration estimates initially provided by user 102. Hence, learned performance can allow for more efficient task scheduling and test plan execution by computing modules of system 100.

Performance distributions for individual tasks can also factor into refining or optimizing task planning for particular tests. For example, test plans can be optimized to more efficiently execute tasks with smaller distributions that require smaller buffer windows as they are less likely to cause delays. Furthermore, analysis of historical performance data/metrics can provide insights relating to certain task modalities. For example, system 100 can learned that if pairing two devices over a wired/wireless network does not complete within two seconds, then the function pairing is likely to take at least 10 seconds to complete, e.g., see graphical data 406.

In some implementations, a test plan can include a "Test 2, Action 1" (e.g., a task) that is known to take three seconds. Through learned inferences/experiences (data), system 100 can determine that "Test 1, Validation 2" will either take roughly two seconds or at least 10 seconds. Revised test plan 404 indicates that, if "Test 1, Validation 2" during execution takes longer than two seconds (plus some margin) then system 100 can cause "Test 2, Action 1" to be executed before "Test 1, Validation 2" is expected to complete. Hence, the learned execution time enabled more accurate conditional merging of task strings for producing revised test plan 404.

System 100 can use task master 106 to execute periodic or event based task re-planning. For example, task master 106 can be programmed to automatically re-plan testing tasks after the occurrence of certain test errors or certain test failures, or after receiving certain user inputs or other data parameters configured to trigger task re-planning. In general, task re-planning in response to an overall system state, such as an error or failure, provides robustness to downed robots and devices. For task re-planning, system 100 can re-configure the smart devices through software commands to account for downed smart devices while downed robots are planned around until maintenance provides repairs. Depending on design preferences, system 100 can also account for the shifting position of devices. For example, an estimated device position can be initially provided and computer vision algorithms can be used to correct for system drift over time. In some implementations, system 100 uses quick response (QR) code readers or 3D model matcher to deduce/determine device positions to detect device shifts or system drift over time.

Figure 5:
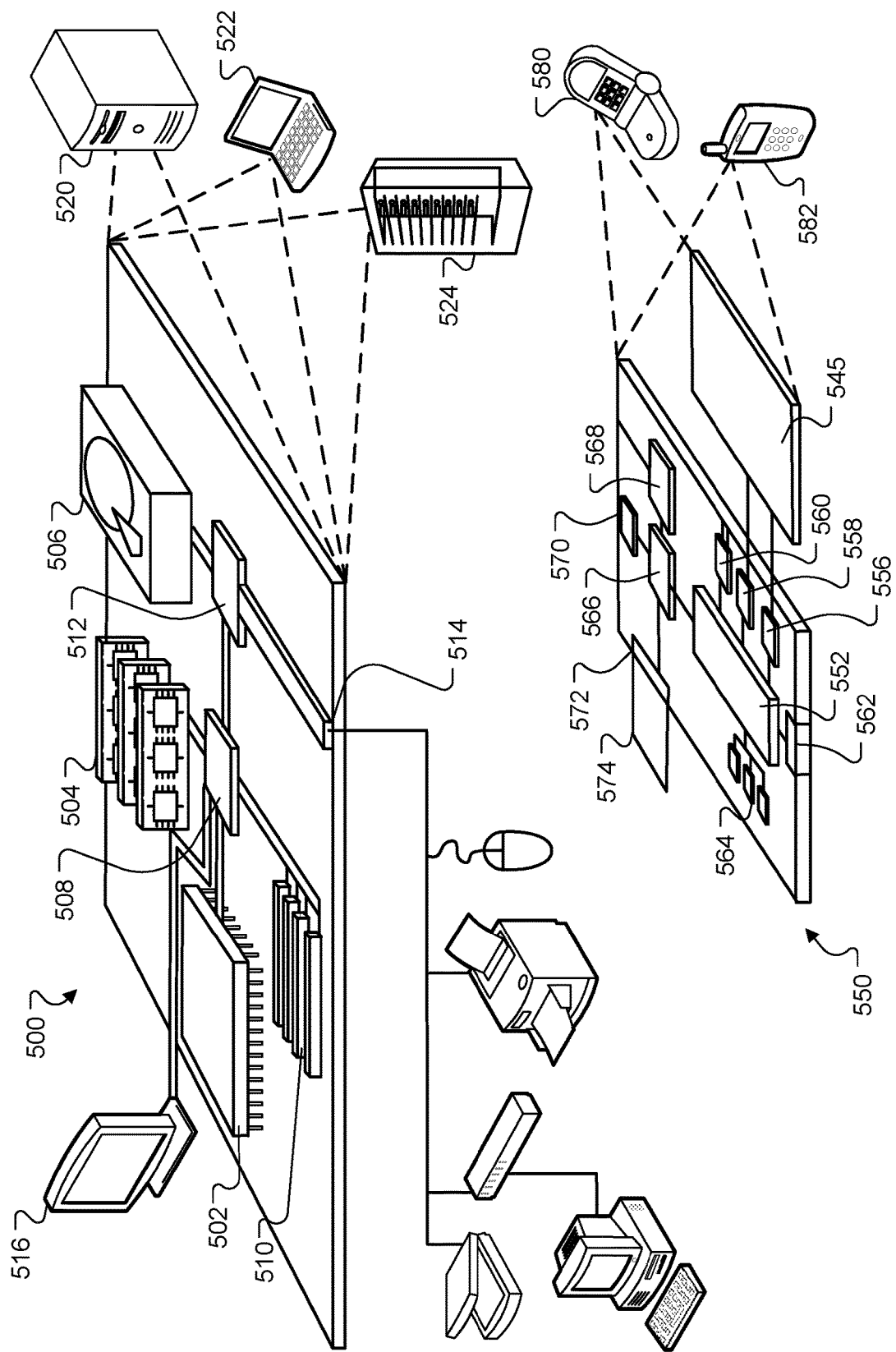
FIG. 5 shows a block diagram of a computing system that can be used in connection with computer-implemented methods described in this specification.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations, e.g., as a server bank, a group of blade servers, or a multi-processor system.

The memory 504 stores information within the computing device 500. In one implementation, the memory 504 is a computer-readable medium. In one implementation, the memory 504 is a volatile memory unit or units. In another implementation, the memory 504 is a non-volatile memory unit or units.

The storage device 506 is capable of providing mass storage for the computing device 500. In one implementation, the storage device 506 is a computer-readable medium. In various different implementations, the storage device 506 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of duties is exemplary only. In one implementation, the high-speed controller 508 is coupled to memory 504, display 516, e.g., through a graphics processor or accelerator, and to high-speed expansion ports 510, which may accept various expansion cards (not shown). In the implementation, low-speed controller 512 is coupled to storage device 506 and low-speed expansion port 514. The low-speed expansion port, which may include various communication ports, e.g., USB, Bluetooth, Ethernet, wireless Ethernet, may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can process instructions for execution within the computing device 550, including instructions stored in the memory 564. The processor may also include separate analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD display or an OLED display, or other appropriate display technology. The display interface 556 may include appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication, e.g., via a docking procedure, or for wireless communication, e.g., via Bluetooth or other such technologies.

The memory 564 stores information within the computing device 550. In one implementation, the memory 564 is a computer-readable medium. In one implementation, the memory 564 is a volatile memory unit or units. In another implementation, the memory 564 is a non-volatile memory unit or units. Expansion memory 574 may also be provided and connected to device 550 through expansion interface 572, which may include, for example, a SIMM card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS receiver module 570 may provide additional wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550.

Such sound may include sound from voice telephone calls, may include recorded sound, e.g., voice messages, music files, etc., and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back-end component, e.g., as a data server, or that includes a middle-ware component such as an application server, or that includes a front-end component such as a client computer having a graphical user interface or a Web browser through which a user can interact with an implementation of the systems and techniques described here, or any combination of such back-end, middleware, or front-end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In addition, certain data may be treated in one or more ways before it is stored or used, so that personally identifiable information is removed. For example, in some embodiments, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

A number of embodiments have been described. Nevertheless, it will be understood that various modifications may be made without departing from the spirit and scope of the invention. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A computer-implemented method comprising:
generating, by a task module of a computing system, multiple distinct test plans for performing automated robotic testing on multiple devices using a robotics system that mimics human interaction with the devices;
merging, by the task module, each of the multiple distinct test plans to produce a first test plan for performing automated robotic testing of the device, for execution by the robotics system that mimics human interaction with the devices, comprising:

identifying, in each of the multiple distinct test plans, one or more strings that describe actions that will be performed based on the respective test plan;

determining, from the one or more strings for each of the multiple distinct test plans, matching strings that a) are included in at least two different test plans and b) describe actions (i) that will be performed based on the respective test plan and (ii) have the same start state;

identifying overlapping test portions that are included in the at least two different test plans based on determining the matching strings that are included in at least two different test plans, and merging the at least two different test plans using least on the overlapping test portions;

obtaining, by the computing system, performance data about automated execution of the first test plan by the robotics system that mimics human interaction with the devices;

generating, by a learning module of the computing system and based on analysis of the performance data, a set of learned inferences that represent predictions about execution of the first test plan;

adjusting, by the task module, the first test plan based on the set of learned inferences that represent predictions about execution of the first test plan;

generating, by the task module and based on adjustments to the first test plan, a second test plan for execution by the computing system; and performing, by the computing system, the second test plan to test the multiple devices using the robotics system that mimics human interaction with the devices.

2. The method of claim 1, wherein merging each of the multiple distinct test plans comprises:

identifying one or more transitions across the two different test plans, wherein a transition represents changing from a first testing action to a second testing action within a test plan; and merging the at least two different test plans using the identified overlapping portions and the identified one or more transitions.

3. The method of claim 2, wherein merging each of the multiple distinct test plans comprises:

weighting the merging towards one or more initial test steps of the at least two different test plans, where a step that follows an initial test step is non-time dependent; and merging steps in the two test different plans that have text strings that describe testing actions associated with an initial test steps for testing multiple devices of the same device type.

4. The method of claim 1, wherein adjusting the first test plan comprises:

optimizing the first test plan to generate the second test plan, wherein the first test plan is optimized using inferred learnings from executing the first test plan.

5. The method of claim 1, wherein generating the set of learned inferences comprises:

using a neural network to perform inference computations as part of the analysis of the performance data about automated execution of the first test plan; and generating the set of learned inferences based on the inference computations.

6. The method of claim 1, wherein performing the second test plan includes:

causing, by the robotics system, one or more physical perturbations at a device that is under test, wherein the one or more physical perturbations are caused around a desired location of the device based on a characteristic of an input feature of the device.

7. The method of claim 1, wherein performing the second test plan comprises:

determining one or more error parameters for a random human error simulation; and randomly simulating human error using the one or more error parameters by overshooting or undershooting device processing goals of the device that is under test.

8. The method of claim 1, comprising:

detecting a test error or a test failure, wherein:

obtaining the performance data is responsive to detecting the test error or the test failure.

9. The method of claim 8, wherein detecting the test error or the test failure comprises detecting an error caused by drift in the robotics system.

10. A system comprising:

one or more processing devices; and one or more non-transitory machine-readable storage devices storing instructions that are executable by the one or more processing devices to cause performance of operations comprising:

generating, by a task module of a computing system, multiple distinct test plans for performing automated robotic testing on multiple devices using a robotics system that mimics human interaction with the devices;

merging, by the task module, each of the multiple distinct test plans to produce a first test plan for performing automated robotic testing of the device, for execution by the robotics system that mimics human interaction with the devices, comprising:

identifying, in each of the multiple distinct test plans, one or more strings that describe actions that will be performed based on the respective test plan;

determining, from the one or more strings for each of the multiple distinct test plans, matching strings that a) are included in at least two different test plans and b) describe actions (i) that will be performed based on the respective test plan and (ii) have the same start state;

identifying overlapping test portions that are included in the at least two different test plans based on determining the matching strings that are included in at least two different test plans, and merging the at least two different test plans using least on the overlapping test portions;

obtaining, by the computing system, performance data about automated execution of the first test plan by the robotics system that mimics human interaction with the devices;

generating, by a learning module of the computing system and based on analysis of the performance data, a set of learned inferences that represent predictions about execution of the first test plan;

adjusting, by the task module, the first test plan based on the set of learned inferences that represent predictions about execution of the first test plan;

generating, by the task module and based on adjustments to the first test plan, a second test plan for execution by the computing system; and performing, by the computing system, the second test plan to test the multiple devices using the robotics system that mimics human interaction with the devices.

11. The system of claim 10, wherein merging each of the multiple distinct test plans comprises:
    identifying one or more transitions across the two different test plans, wherein a transition represents changing from a first testing action to a second testing action within a test plan; and
    merging the at least two different test plans using the identified overlapping portions and the identified one or more transitions.

12. The system of claim 11, wherein merging each of the multiple distinct test plans comprises:
    weighting the merging towards one or more initial test steps of the at least two different test plans, where a step that follows an initial test step is non-time dependent; and
    merging steps in the two test different plans that have text strings that describe testing actions associated with an initial test steps for testing multiple devices of the same device type.

13. The system of claim 10, wherein adjusting the first test plan comprises:
    optimizing the first test plan to generate the second test plan, wherein the first test plan is optimized using inferred learnings from executing the first test plan.

14. The system of claim 10, wherein generating the set of learned inferences comprises:
    using a neural network to perform inference computations as part of the analysis of the performance data about automated execution of the first test plan; and
    generating the set of learned inferences based on the inference computations.

15. The system of claim 10, wherein performing the second test plan includes:
    causing, by the robotics system, one or more physical perturbations at a device that is under test, wherein the one or more physical perturbations are caused around a desired location of the device based on a characteristic of an input feature of the device.

16. The system of claim 10, wherein performing the second test plan comprises:
    determining one or more error parameters for a random human error simulation; and
    randomly simulating human error using the one or more error parameters by overshooting or undershooting device processing goals of the device that is under test.

17. One or more non-transitory machine-readable storage devices storing instructions that are executable by one or more processing devices to cause performance of operations comprising:
    generating, by a task module of a computing system, multiple distinct test plans for performing automated robotic testing on multiple devices using a robotics system that mimics human interaction with the devices;
    merging, by the task module, each of the multiple distinct test plans to produce a first test plan for performing automated robotic testing of the device, for execution by the robotics system that mimics human interaction with the devices, comprising:
        identifying, in each of the multiple distinct test plans, one or more strings that describe actions that will be performed based on the respective test plan;
        determining, from the one or more strings for each of the multiple distinct test plans, matching strings that a) are included in at least two different test plans and b) describe actions (i) that will be performed based on the respective test plan and (ii) have the same start state;
        identifying overlapping test portions that are included in the at least of two different test plans based on determining the matching strings that are included in at least the two different test plans, and
        merging the at least two different test plans using least on the overlapping test portions;
    obtaining, by the computing system, performance data about automated execution of the first test plan by the robotics system that mimics human interaction with the devices;
    generating, by a learning module of the computing system and based on analysis of the performance data, a set of learned inferences that represent predictions about execution of the first test plan;
    adjusting, by the task module, the first test plan based on the set of learned inferences that represent predictions about execution of the first test plan;
    generating, by the task module and based on adjustments to the first test plan, a second test plan for execution by the computing system; and
    performing, by the computing system, the second test plan to test the multiple devices using the robotics system that mimics human interaction with the devices.

18. The machine-readable storage devices of claim 17, wherein adjusting the first test plan comprises:
    optimizing the first test plan to generate the second test plan, wherein the first test plan is optimized using inferred learnings from executing the first test plan.

19. The machine-readable storage devices of claim 17, wherein generating the set of learned inferences comprises:
    using a neural network to perform inference computations as part of the analysis of the performance data about automated execution of the first test plan; and
    generating the set of learned inferences based on the inference computations.

* * * * *

UNITED STATES PATENT AND TRADEMARK OFFICE
CERTIFICATE OF CORRECTION

Page 1 of 1

PATENT NO. : 10,838,850 B2
APPLICATION NO. : 16/199983
DATED : November 17, 2020
INVENTOR(S) : Nicholas Akiona, Teresa Sheausan Tung and Carl Matthew Dukatz It is certified that error appears in the above-identified patent and that said Letters Patent is hereby corrected as shown below:

In the Claims

In Claim 17, Column 18, Line 18 (approx.), before "two" delete "of".

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*